(12) United States Patent  (10) Patent No.: US 8,988,143 B2
Berkhout  (45) Date of Patent: Mar. 24, 2015

(54) SWITCHABLE CURRENT SOURCE CIRCUIT AND METHOD

(71) Applicant: NXP B.V., Eindhoven (NL)

(72) Inventor: Marco Berkhout, Tiel (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/201,581

(22) Filed: Mar. 7, 2014

(65) Prior Publication Data

US 2014/0312963 A1    Oct. 23, 2014

(30) Foreign Application Priority Data

Mar. 13, 2013  (EP) .................................... 13158925

(51) Int. Cl.
G05F 1/10       (2006.01)
G05F 3/02       (2006.01)
G05F 3/26       (2006.01)
H03K 17/042     (2006.01)
H03F 3/00       (2006.01)

(52) U.S. Cl.
CPC ....... *G05F 3/02* (2013.01); *G05F 3/262* (2013.01); *H03K 17/04206* (2013.01); *H03F 3/00* (2013.01)

USPC ........... 327/543; 327/538; 327/541; 323/312; 323/315

(58) Field of Classification Search
USPC ............................ 327/530–546; 323/312–317
See application file for complete search history.

(56) References Cited

U.S. PATENT DOCUMENTS

| | | | |
|---|---|---|---|
| 6,236,252 B1 * | 5/2001 | Genest et al. .................. | 327/178 |
| 6,859,091 B1 * | 2/2005 | Nicholson et al. ............. | 327/536 |
| 8,519,694 B2 * | 8/2013 | Berkhout ....................... | 323/315 |
| 2006/0097774 A1 * | 5/2006 | Hasegawa ...................... | 327/538 |
| 2008/0157875 A1 * | 7/2008 | Behzad et al. ................ | 330/288 |
| 2009/0147542 A1 * | 6/2009 | Kuttner et al. ................. | 363/16 |
| 2012/0007660 A1 * | 1/2012 | Hummerston et al. ........ | 327/530 |

FOREIGN PATENT DOCUMENTS

EP   2 354 882 A1   8/2011

* cited by examiner

*Primary Examiner* — Brandon S Cole

(57) ABSTRACT

A switchable current source in which a reference voltage value to be used in driving the gate of an output transistor is sampled and stored. The reference voltage is derived using a reference current source which feeds a current sensing transistor. The current sensing transistor is turned off when the output transistor is turned off, so that the reference current source then does not consume power. A large reference current Iref can then be used for a short time.

8 Claims, 10 Drawing Sheets

US 8,988,143 B2

SWITCHABLE CURRENT SOURCE CIRCUIT AND METHOD

CROSS-REFERENCE TO RELATED APPLICATIONS

This application claims the priority under 35 U.S.C. §119 of European patent application no. 3158925.1, filed on Mar. 13, 2013, the contents of which are incorporated by reference herein.

This invention relates to switchable current source circuits, i.e. circuits that provide a desired current at their output and can be switched on or off.

An important aspect of switching electronic circuits such as class-D amplifiers and switch-mode power supplies is electro-magnetic compatibility (EMC).

One of a few measures that can be taken in a switching design to improve EMC performance is to slow down the transition speed of the output voltage node. This is commonly referred to as 'slope control'. A well-known method of obtaining a constant slope at the output when turning on a power MOSFET is to exploit the feedback Miller-effect of the parasitic gate-drain capacitance Cgd of the power MOSFET.

FIG. 1 shows an example of power MOSFET with slope control when turning the transistor on. The gate drain capacitance Cgd and the diode are part of the transistor equivalent circuit.

In the circuit configuration shown in FIG. 1, the gate of power transistor Mpower is charged by a current source Icharge. The graph on the right-hand side of FIG. 1 shows the voltage transients of the gate voltage Vgate and output voltage Vout.

Initially, transistor Mpower is turned off and the output voltage Vout is high, i.e. near to the supply voltage. The gate voltage Vgate increases steadily until it reaches the threshold voltage VT of the power transistor Mpower. At this point in time, Mpower starts to conduct and pulls down the output node Vout. During the transition of the output node Vout, a large rate of change of voltage (dV/dt) appears across the parasitic gate-drain capacitance Cgd causing all available current Icharge to flow into Cgd.

Consequently, the gate voltage Vgate remains almost the same during the output transition yielding a characteristic pedestal in the gate voltage transient. After the transition of the output node has finished, the gate voltage is charged further until it reaches its final value. The rate of change or 'slope' of the output voltage Vout during the transition is controlled by the magnitude of the current Icharge and the parasitic gate-drain capacitance Cgd:

$$\frac{d}{dt}V_{out} = \frac{I_{charge}}{C_{gd}} \quad (1)$$

Transition times typically are of the order of a few tens of nanoseconds. In order to obtain a constant slope during the transition, a current source Icharge is required that can be switched on and settle very fast.

This invention relates to the control of a transistor functioning as a current switch. The term "current switch" refers to an accurate current source that can be switched on and off.

The most basic circuit implementation of a current switch is shown in FIG. 2.

The circuit comprises a reference current source Iref. The current source current is mirrored to the output Iout by a current mirror circuit that comprises input and output transistors Min and Mout. The current mirror circuit is essentially turned on and off by a control transistor Mctrl, which is used to short the two current mirror transistors to turn them rapidly off.

When the control signal ctrl is high, transistor Mctrl is turned on and it shorts the gates of Min and Mout to ground. The current switch is off and the output current Iout is zero. When the control signal ctrl is low, transistor Mctrl is turned off and the reference current Iref is mirrored through Min and Mout.

The output current Iout is now equal to the reference current Iref multiplied by the size ratio between Min and Mout.

Many alternative implementations are known that improve the speed and/or the accuracy of the current mirror. A number of alternatives is shown in FIG. 3.

The configuration shown in FIG. 3(a) has a unity-gain buffer A0 that decouples the gate of output transistor Mout from the input node. When Mout is very large, this improves the speed of the current mirror since the charge to load the gate of Mout is now sourced by the amplifier instead of the input reference current Iref. However, the input transistor Min and the unity-gain buffer form a feedback loop that can become unstable.

In the configuration shown in FIG. 3(b) the input transistor Min is diode-connected and the unity-gain buffer A0 copies the gate voltage of Min to the gate of Mout without forming a feedback loop. Because there is no feedback loop, this configuration will have no stability problems but it is less accurate because the finite gain and offset of amplifier A0 will introduce an error.

In the configuration shown in FIG. 3(c), the inverting input of amplifier A0 is connected to the output node. In this configuration, the feedback loop that is now formed by the amplifiers and both transistors Min and Mout forces the input voltage to be equal to the output voltage. Since now both transistors have the same gate-source voltage as well as the same drain-source voltage, the accuracy of the mirror is greatly improved. However, the stability of the feedback loop now depends on the impedances connected to the input and output.

A particular problem with the current switch shown in FIG. 2 appears when the ratio between input transistor Min and output transistor Mout is very large, e.g. 1:1000. In this case, turn-on of the current switch becomes very slow since the current that charges the gate of Mout needs to be provided by the input reference current Iref. The alternatives shown in FIG. 3 solve this problem but can have problems with stability.

Also, in order to achieve a very high speed, the amplifier used in these configurations requires a lot of power. Note that turning off a current switch is less of a problem; any desired speed can readily be achieved by appropriate dimensioning of transistor Mctrl.

EP 2 354 882 discloses an arrangement in which when a current switch is turned on, the amount of charge that is required to increase the gate voltage of an output transistor to the same level as that of an input transistor Min is to the first order constant. This is achieved by precharging a charge storage device of appropriate size up to a voltage that is higher than the desired gate voltage of the output transistor and then discharging the charge storage device onto the gate of the output transistor by means of a switch. This means that the control of the gate voltage of the output transistor is based on the required amount of charge to be supplied to the gate (because the initial condition of the output transistor is known when it is discharged) rather than based on the desired voltage. Thus, controlled charge flow is provided to the output transistor gate rather than the application of a controlled voltage.

It is in some cases desirable to reduce the circuit area of the prior art circuit. Also, the small value of the reference current Iref limits the precharge speed of the circuit, i.e. the time that is required to recharge the charge storage device used after the discharge phase.

The invention is defined by the claims.

According to the invention, there is provided a switching circuit for providing a switched current source output, comprising:

a reference voltage input device, which comprises a reference voltage charge storage device;

a gate voltage charge storage arrangement for storing a precharge voltage derived from the reference voltage;

a reference current source providing a reference current;

an output transistor;

a current sensing transistor for generating a sense current dependent on the current source output and which is supplied by the reference current source;

an isolating switch arrangement for selectively coupling or isolating the gate of the output transistor and the gate of the current sensing transistor to or from the gate voltage charge storage arrangement;

a discharge switch arrangement for discharging the gate of the output transistor and the gate of the current sensing transistor;

a feedback loop for controlling the reference voltage stored on the reference voltage charge storage device to maintain the sense current equal to the reference current.

This arrangement samples a reference voltage value and stores it on a reference voltage charge storage arrangement (e.g. one or more capacitors). The reference voltage is derived using a reference current source, as in the known circuits. However, the reference current source supplies the sense transistor as its load. This sense transistor is turned off when the output transistor is turned off, and the reference current source then saturates (with no load) and does not consume power. The invention thus provides an arrangement in which a large reference current Iref can be used for a short time. The reference voltage which is derived from this reference current source is sampled on a reference voltage charge storage device to permit the non-continuous use of the reference current source. The feedback arrangement also ensures that the sampled reference voltage is that which is needed such that the output current is a scaled version of the reference current.

Preferably, the circuit is operable in two modes:

a precharge mode, in which the gate voltage charge storage arrangement is precharged by the reference voltage and the output transistor gate and the sense transistor gate is discharged through the discharge switch arrangement, and the isolating switch arrangement isolates the gate storage device from the output transistor gate; and a discharge mode, in which the gate voltage charge storage arrangement is discharged to the output transistor gate and sense transistor gate through the isolating switch arrangement.

The reference voltage to which the gate voltage charge storage device is precharged is higher than the voltage that appears on the gate during the subsequent discharge phase.

The reference voltage input device can comprise a comparator, which depending on the sign of a difference between the reference current and the sense current, controls the charging or discharging of the reference voltage charge storage device. In this way, the feedback loop controls the reference voltage to achieve the desired relationship between the reference current and the output current.

A pull up current source and a pull down current source can be used, and the comparator output is then used to couple a selected one of the pull up and pull down current sources to the reference voltage charge storage device. This provides cyclical charging and discharging of the reference voltage charge storage device to vary the stored reference voltage.

The comparator can comprises a window comparator and a pulse converter can be used for converting the window comparator output to up and down pulses for controlling the pull up current source and the pull down current source.

A buffer is preferably provided between the reference voltage input device and the gate voltage charge storage device. This can be a unity gain buffer.

The invention can be used in as a switching output stages for a class-D amplifier or for a switch-mode power supply.

The invention also provides a method for providing a switched current source output, comprising:

in a precharge mode, charging a gate voltage charge storage arrangement (Cbuf) to a precharge voltage derived from a reference voltage (Vref), discharging the gate of an output transistor (Mout) and discharging the gate of a current sensing transistor, wherein the current sensing transistor mirrors the output current from the output transistor using a reference current source (Iref) as its current supply; and in a discharge mode, discharging the gate voltage charge storage arrangement (Cbuf) to the gate of the output transistor (Mout) and sense transistor (Msense) to raise the gate voltage by an amount depending on the charge flow, adjusting the reference voltage (Vref) in dependence on the sense current (Isense) through the current sensing transistor (Msense) and sampling the reference voltage (Vref) such as to maintain the sense current (Isense) substantially equal to the reference current (Iref).

Examples of the invention will now be described in detail with reference to the accompanying drawings, in which:

FIG. 1 shows a known example of power MOSFET with slope control when turning the transistor on;

Figure 1:
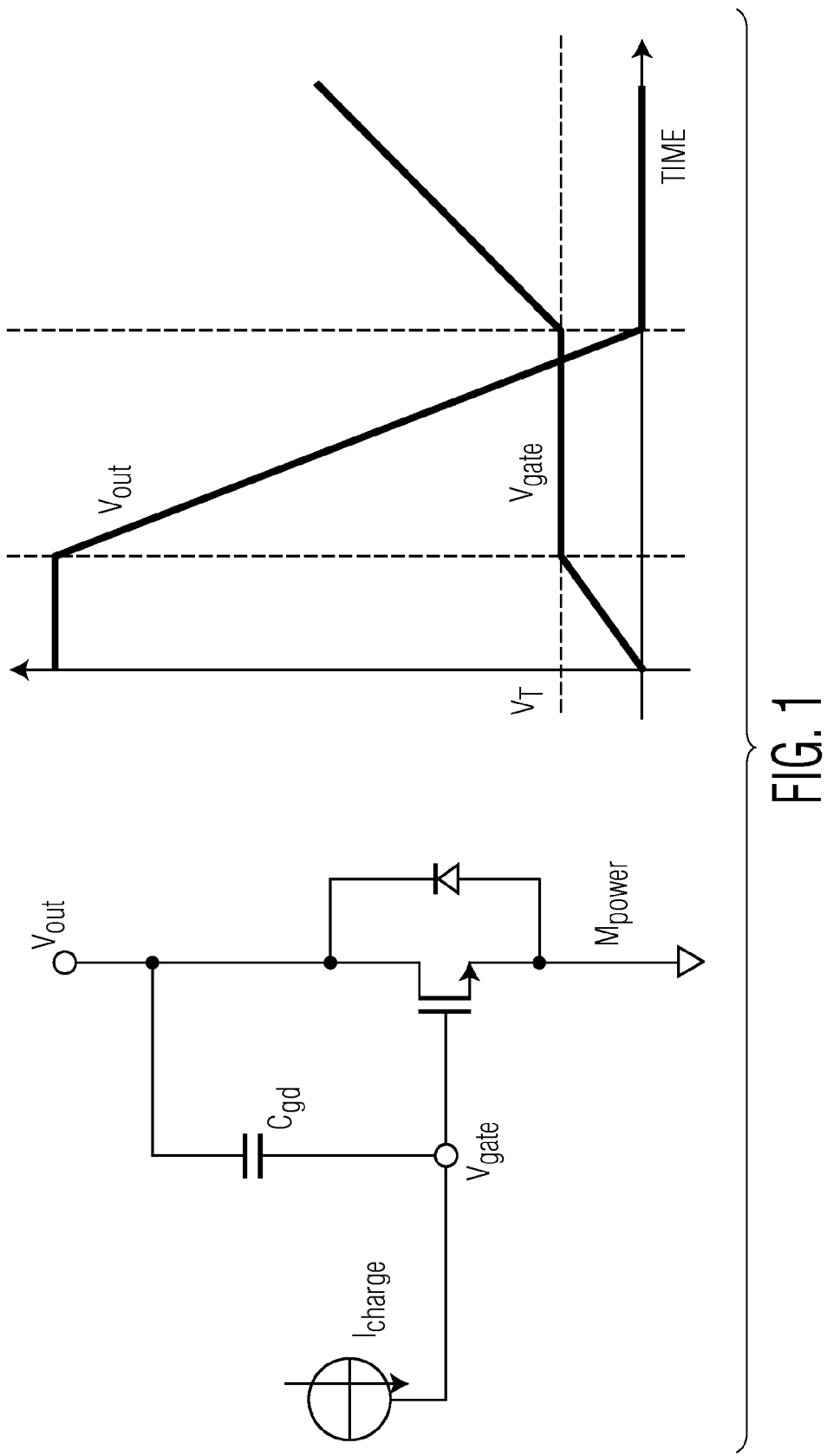
Figure 2:
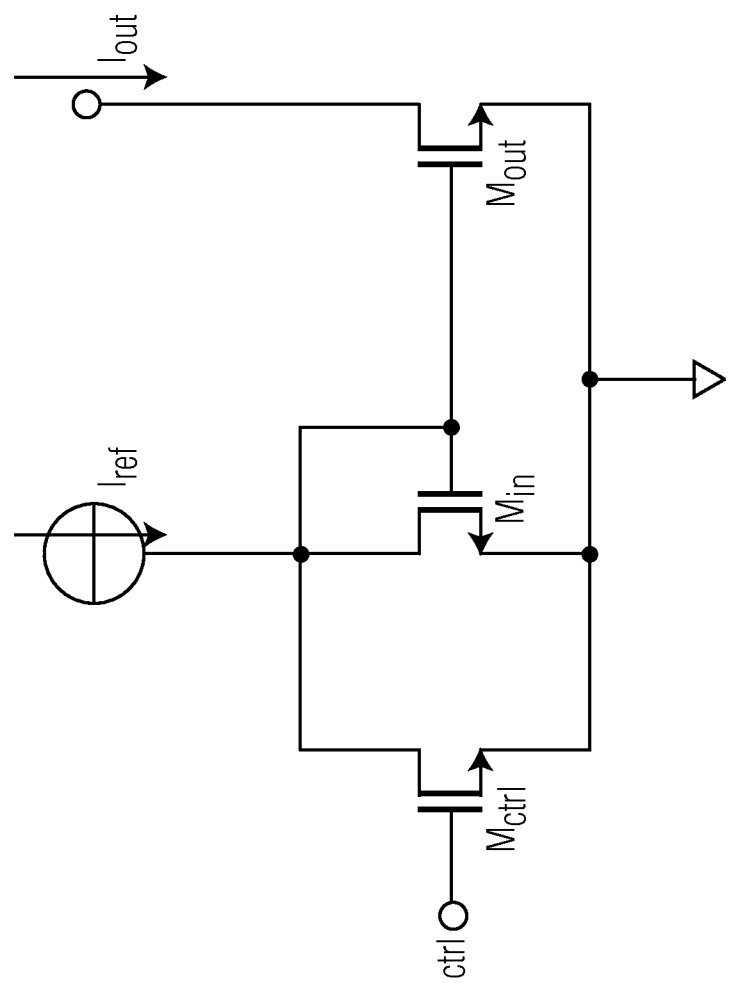
FIG. 2 shows a known basic circuit implementation of a current switch.
Figure 3A:
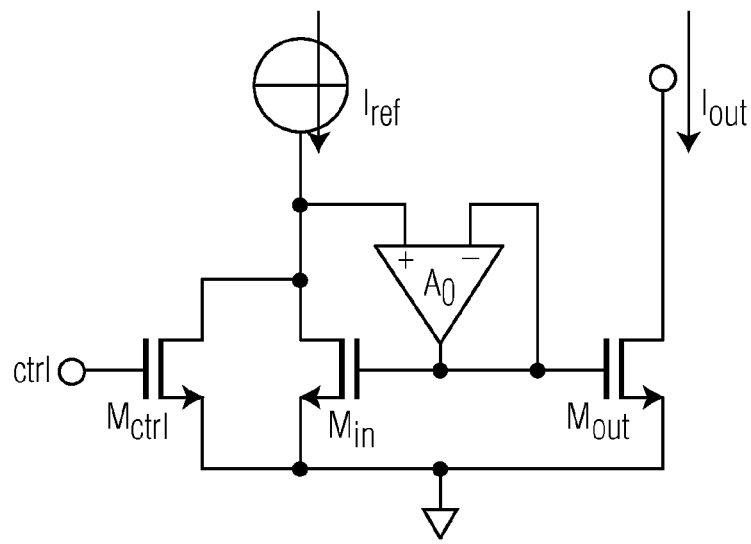
FIG. 3 shows a number of alternatives to the current switch circuit of FIG. 2.
Figure 3B:
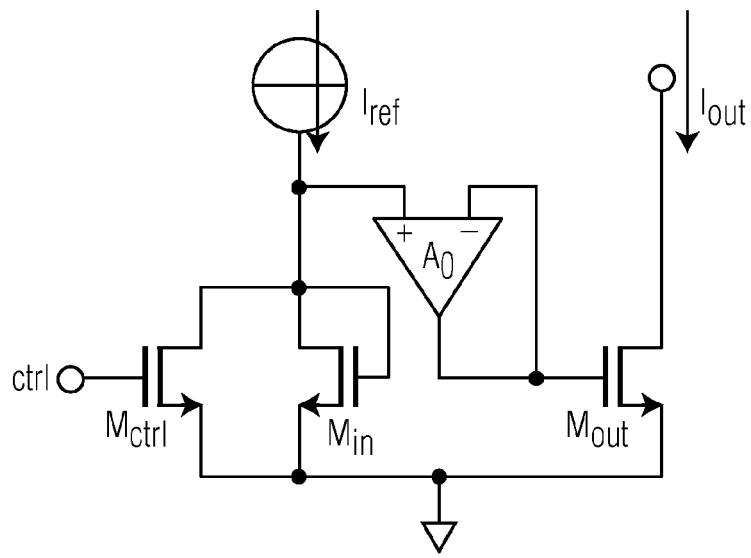
Figure 3C:
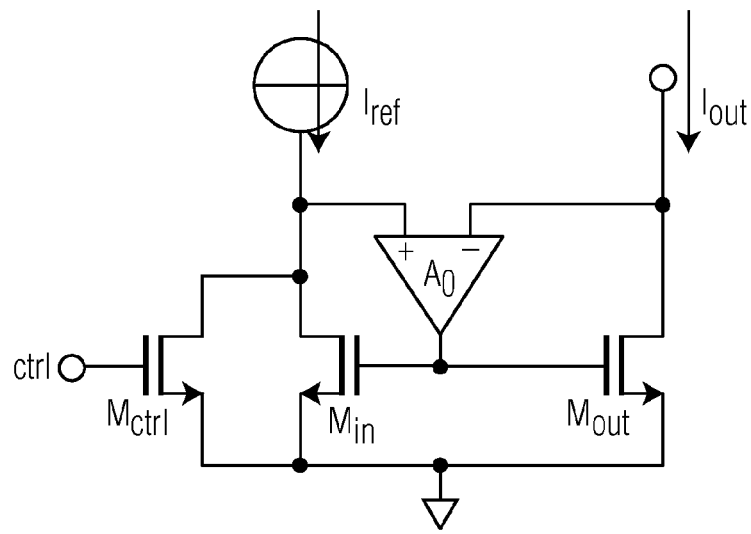
Figure 4A:
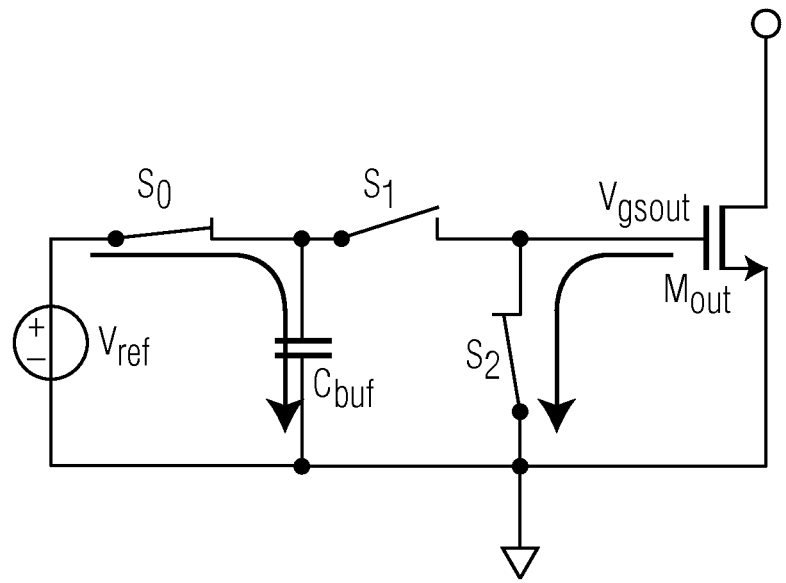
Figure 4B:
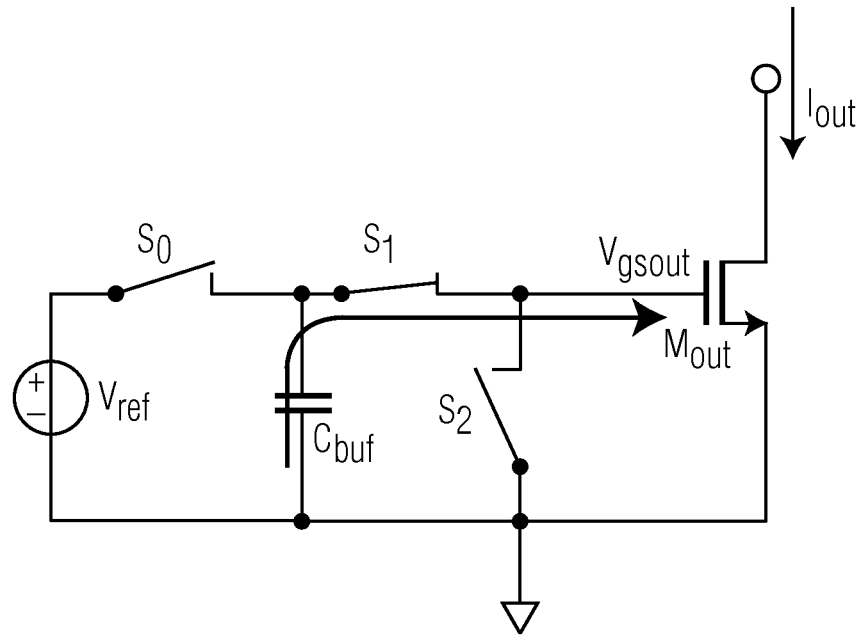
Figure 5:
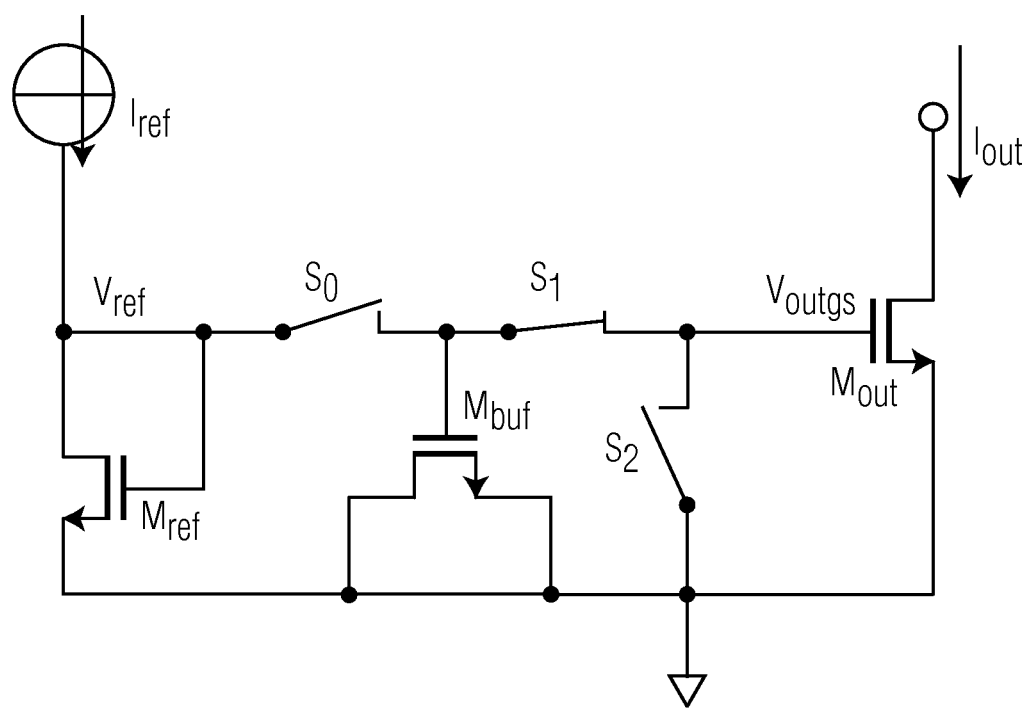
Figure 6:
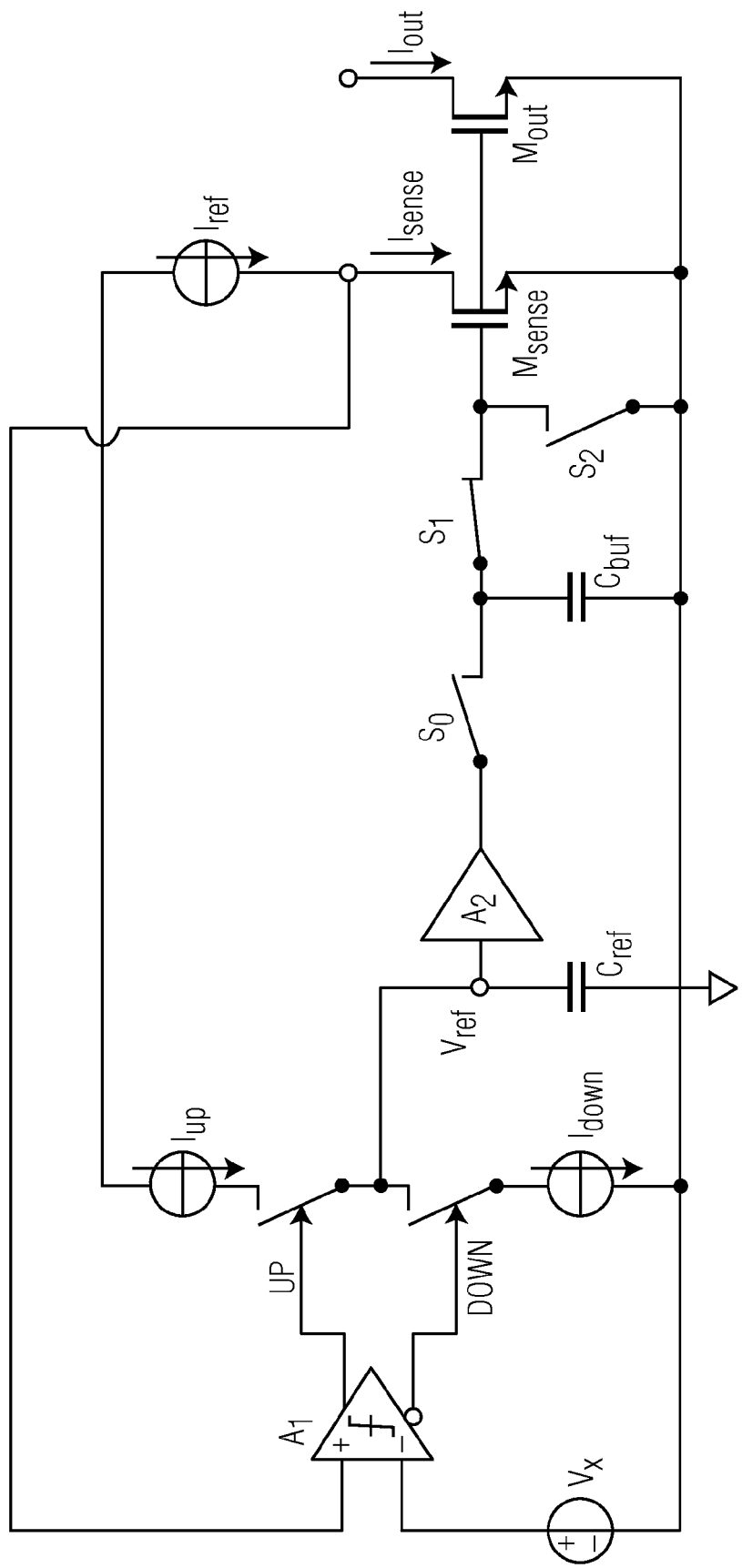
Figure 7:
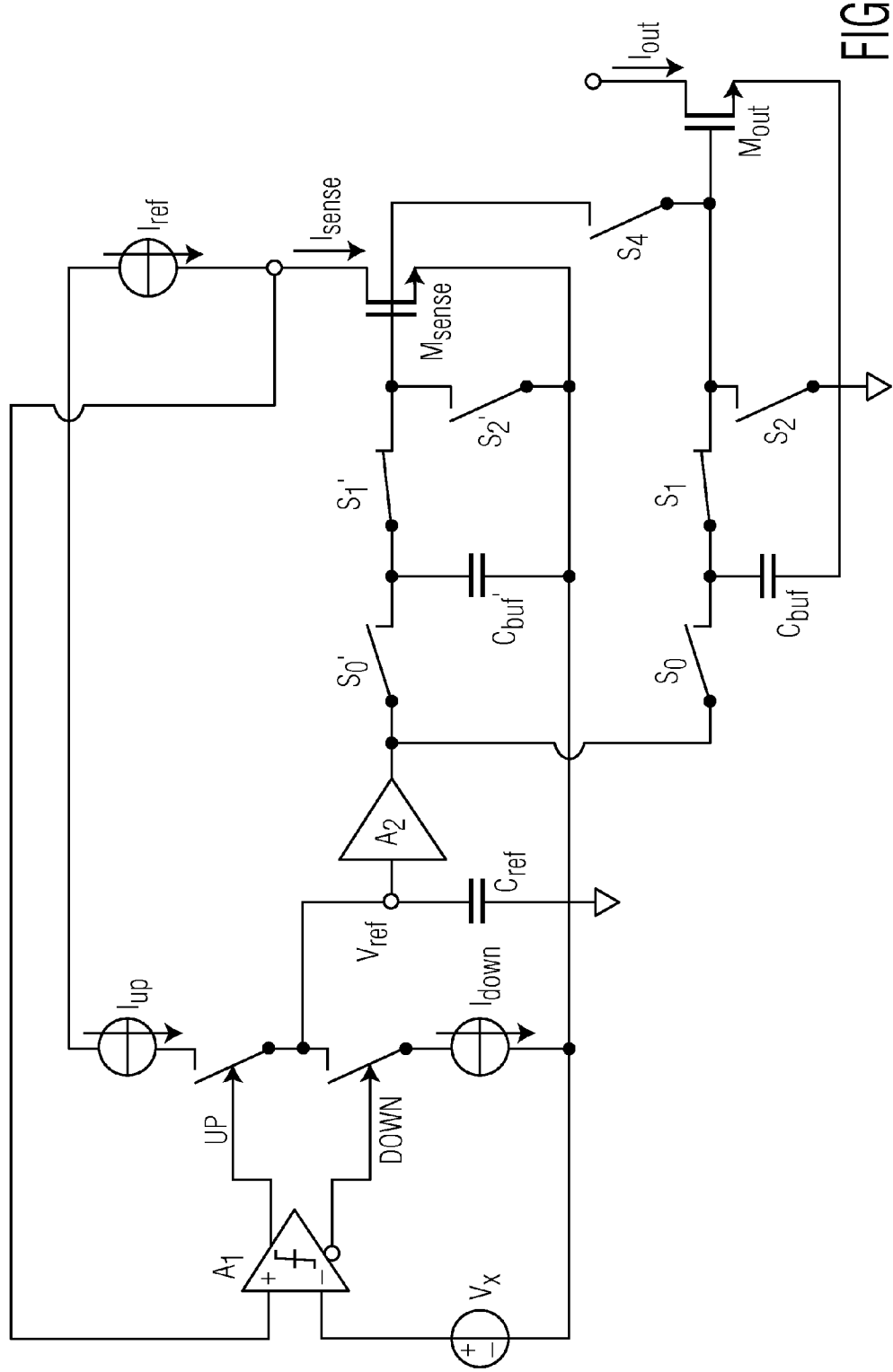
Figure 8:
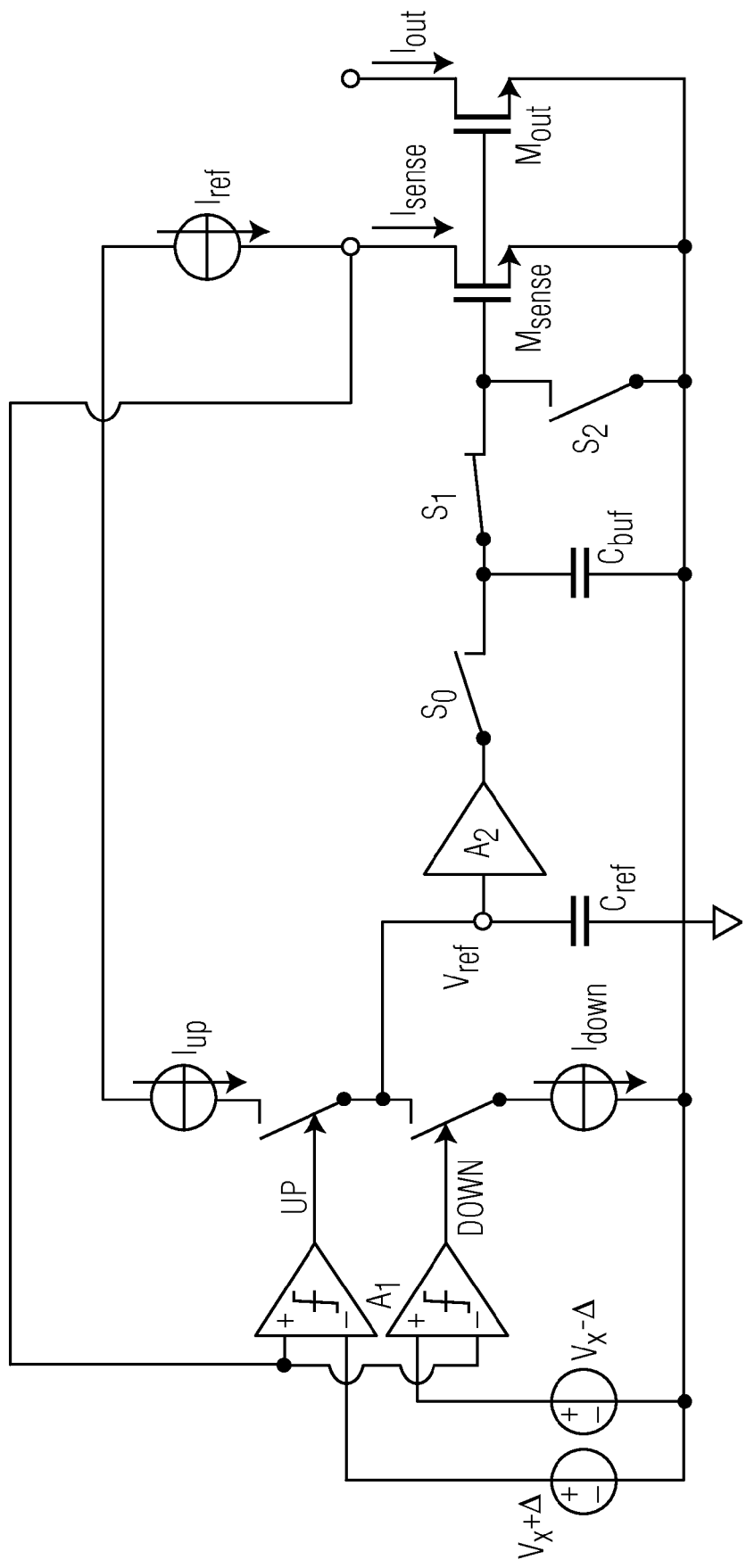
Figure 9:
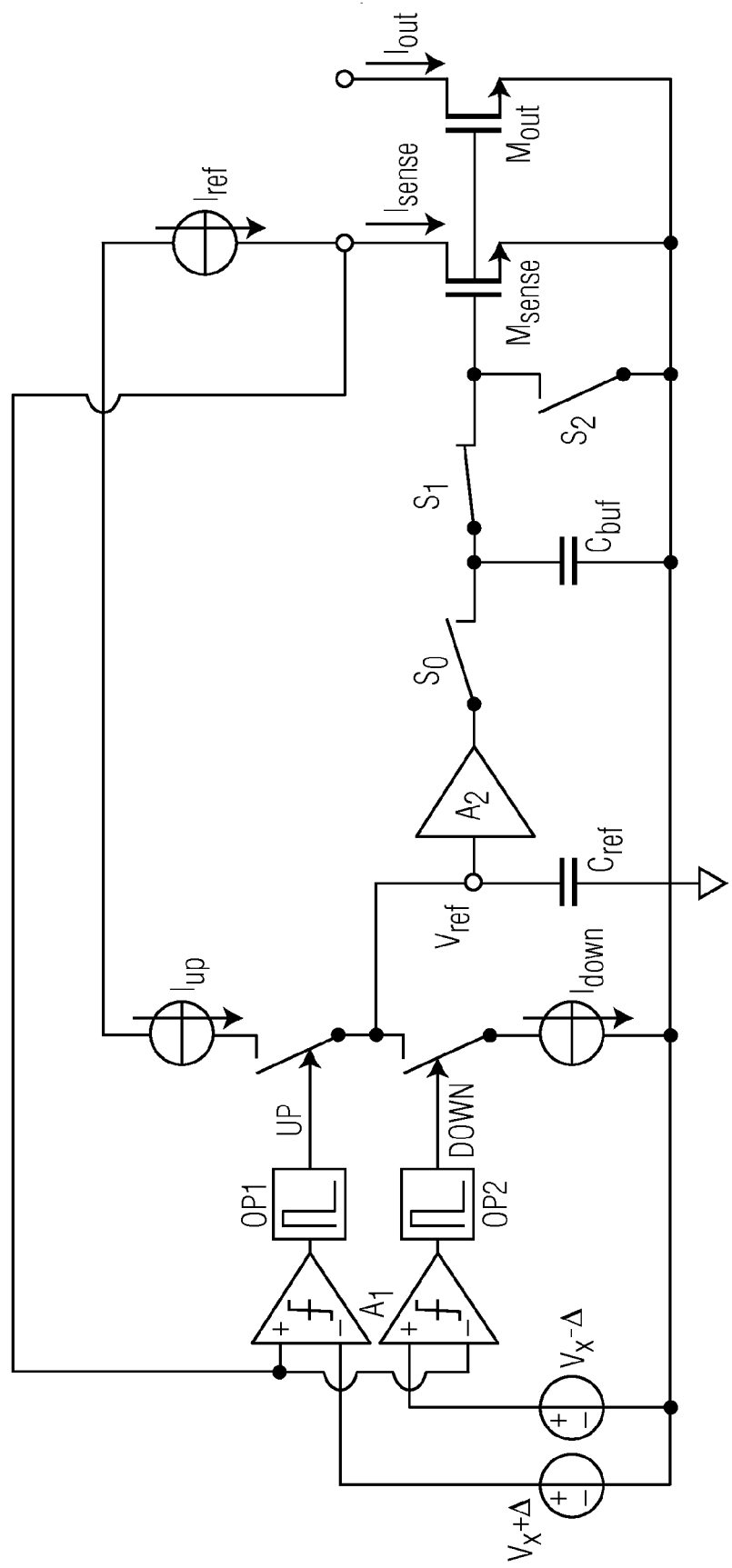

FIGS. 4(a) and (b) are used to explain conceptually the operation of a circuit previously proposed by the applicant;

FIG. 5 shows an implementation of storage capacitor and reference voltage for the circuit of FIG. 4;

FIG. 6 is a first example of circuit of the invention;

FIG. 7 is a second example of circuit of the invention;

FIG. 8 is a third example of circuit of the invention;

FIG. 9 is a fourth example of circuit of the invention; and

Figure 10:
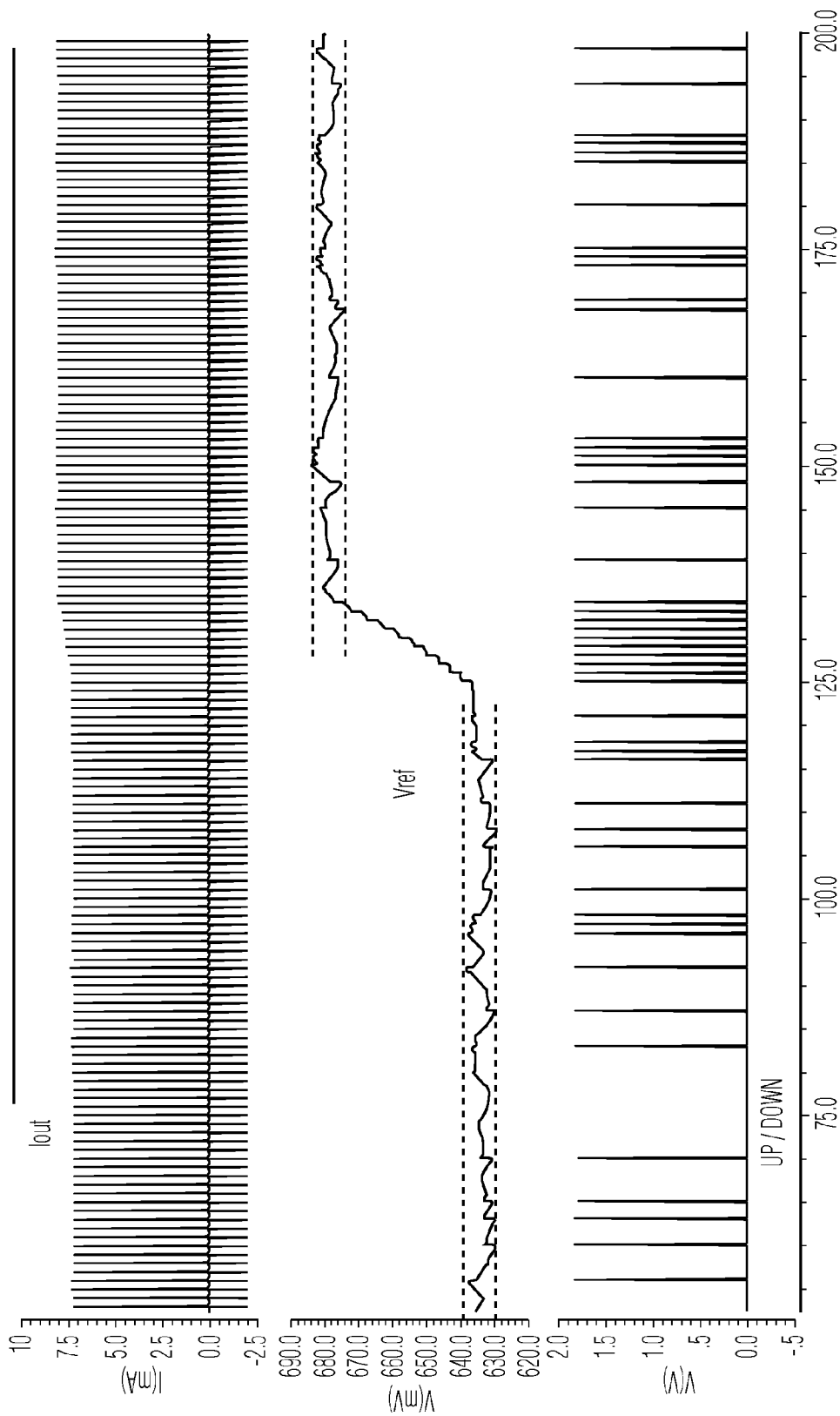

FIG. 10 is a timing diagram to explain the operation of the circuits of the invention.

The invention provides a switchable current source in which a reference voltage value to be used in driving the gate of an output transistor is sampled and stored. The reference voltage is derived using a reference current source which feeds a sense transistor. The sense transistor is turned off when the output transistor is turned off, so that the reference current source then does not consume power. A large reference current Iref can then be used for a short time.

EP 2 354 882 discloses an implementation for a fast current switch based on a simple-switched capacitor circuit as shown in FIG. 4. In a precharge phase shown in FIG. 4(a), the gate of output transistor Mout is shorted to its source by switch S2 while a buffer capacitor Cbuf is charged to a reference voltage Vref through switch S0. The current through Mout is zero.

In the discharge phase shown in FIG. 4(b), switches S0 and S2 are opened and S1 is closed. The charge stored on Cbuf is now redistributed on the gate of Mout.

The time constant of the charge redistribution is limited by the resistance of the switch and the total capacitance involved and can be made small, e.g. <1 ns. After the charge distribution has finished the gate of Mout is at a constant voltage and Mout now acts as a current source.

The value of the drain current Iout is determined by the size of Mout, the ratio between Cbuf and the input capacitance Cg of the Mout transistor and the reference voltage Vref.

The reference voltage Vref is made using a diode connected transistor that matches with Mout and that is biased with a reference current Iref, as shown in FIG. 5. This also shows the capacitor Cbuf implemented with a MOS transistor Mbuf (with the same gate-oxide as used in Mout).

In this way, the output current is insensitive to process and temperature variations.

In the prior art implementation shown in FIG. 5, the reference current Iref flows continuously so should be made as small as possible, e.g. less than 10 μA, to limit power consumption. The output current Iout only flows during short peaks but can be quite large, e.g. larger than 10 mA. Because the ratio between the reference current Iref and output current Iout is large, the ratio between the aspect ratios (W/L) of the reference transistor Mref and output transistor Mout also needs to be large. In practice this is realized by implementing the reference transistor Mref as a stack of transistors that have the same gate length as Mout, such that a large equivalent gate length can be realized while still maintaining good matching.

A first problem of such a construction is that it can become quite bulky in terms of circuit area. Second, the small value of the reference current Iref limits the precharge speed of the circuit, i.e. the time that is required to recharge Cbuf (i.e. Mbuf) to Vref after the discharge phase.

The invention provides an arrangement which uses the same basic approach as explained with reference to FIGS. 4 and 5, but in which a large reference current Iref is used for a short time, and then the reference voltage is sampled on a reference capacitor Cref.

Because the reference current Iref is flowing with a small duty cycle it can have a very low effective value. Further, a larger value of Iref allows a smaller ratio between the reference and output transistor, which is beneficial for matching. In addition, a buffer can be used between Cref and Cbuf to increase the charging speed.

In this way, the problems of circuit area and small reference current are addressed.

A first example of circuit of the invention is shown in FIG. 6, which provides a reference locked loop.

The circuit comprises the same buffer capacitor Cbuf and switching arrangement S0, S1, S2 as described above with reference to FIGS. 4 and 5. For clarity, this buffer capacitor is termed in the claims a "gate voltage charge storage arrangement (Cbuf)" since it stores a voltage, the corresponding charge for which is subsequently transferred to the gate of the output transistor. The arrangement may comprise one or more capacitors (as seen from FIGS. 6 and 7).

In addition there is a feedback loop based on sensing of the output current. The output current as provided by the output transistor Mout (which is the same as in FIGS. 4 and 5) is mirrored by a current sensing transistor Msense. Msense is a scaled replica of Mout.

The reference current source Iref supplies the current mirror transistor Msense, with a difference current Iref−Isense being supplied to a comparator A1. This comparator A1 controls the connection of switched current sources Iup and Idown to a unity gain buffer A2.

The switched current sources Iup and Idown form a charge pump, similar to that commonly used in Phase-Locked Loops (PLL).

The charge pump formed by the current sources Iup and Idown charge a reference capacitor Cref to a reference voltage Vref, which is then supplied by the unity gain buffer to the switching arrangement. For clarity, this reference capacitor is termed in the claims a "reference voltage charge storage device (Cref)".

The operation of the feedback loop is as follows.

In the precharge phase, switches S0 and S2 are closed and S1 is open in the same way as for the circuit of FIGS. 4 and 5. Again, the buffer capacitor Cbuf is charged (in this case by buffer A2) to the same level as the reference capacitor Cref, while the gates of Msense and Mout are shorted to their sources.

In the discharge phase, switch S0 and S2 are open and S1 is closed as in the circuit of FIGS. 4 and 5. The charge stored on Cbuf is now redistributed on the gates of Mout and Msense.

The additional feedback loop operates as follows.

If the drain current Isense of the current mirror sense transistor Msense is smaller than the reference current Iref, then the drain node of Msense will remain pulled high (because the current mirror sense transistor Msense is turned on). A difference current is provided to the comparator A1 which interprets this signal as a high signal. The output of the comparator closes the switch in series with the Iup current source, which in turn causes the reference voltage Vref to increase.

Consequently, in the next charge phase Isense will be a little higher. Thus, while the sense current is below the reference current, the reference voltage is increased by charging the reference capacitor. This increases the sense current.

If Isense is greater than the reference current Iref, then the difference current is of opposite sign, with the result that the drain node of Msense is pulled down to ground and the comparator closes the switch in series with the Idown current source, causing the reference voltage to decrease.

In this manner the loop will converge to a dynamic equilibrium where the sense current Isense is kept very close to the reference current Iref.

The output current Iout is a scaled up copy of Isense and the accuracy only depends on the matching between Msense and Mout just as it would in a regular current mirror. The feedback system is completely insensitive to process, temperature and supply voltage variations. Also, the voltages across Cref and Cbuf do not have to be equal: any offset of the buffer A2 causing such differences is rejected by the loop.

In this circuit, the reference current Iref can be made quite large because it only flows during the discharge phase. In the precharge phase Msense is switched off and the reference current source will saturate so no current is drawn from the supply.

In a gate driver application, the discharge phase is very short with respect to the precharge phase so the effective current consumption caused by the reference current Iref is negligible.

In FIG. 6, the output current is a current sink. Of course a current source can easily be realized by building the same loop in a complementary fashion using PMOS instead of NMOS transistors.

FIG. 7 shows an alternative embodiment in which the output transistor Mout has one switching arrangement S0, S1, S2 and buffer capacitor Cbuf, and the sense transistor Msense has a separate switching arrangement S0', S1', S2' and buffer capacitor Cbuf. The gate of the output transistor Mout is coupled to the gate of the sense transistor Msense through an additional switch S4.

This has the advantage that the feedback loop can already start regulating the reference voltage before the output is enabled. By opening switches S0 and S4 and closing switches S1 and S2, the output transistor Mout is switched off and disconnected from the loop.

The output is enabled by the switching operations described above, namely switching S0,S0' and S2,S2' for the precharge phase, and switching S1,S1' together with S4 for the discharge phase.

The switches S2 and S2' can be considered to be a switching arrangement, which between them control the shorting of both the output transistor and the sense transistor. Similarly, the switches S1 and S1' can be considered to be an isolating switching arrangement, which between them control the isolation of the gate voltage charge storage arrangement (i.e. the buffer capacitors) from the respective transistor gates.

If the ratio of the capacitors Cbuf/Cbuf is made equal to the ratio Mout/Msense then the gate source voltages of Msense and Mout should be equal in all phases of operation. However, by connecting the gates during the discharge phase by means of S4, this equality is guaranteed even if the ratios are not accurately matched.

In a similar manner multiple output transistors can be added that can be enabled/disabled independently. This is useful when the power transistors in a class-D output stage are segmented and have to be controllable separately. The only consequence of adding more output transistors is that the load cap of the buffer A2 increases.

FIG. 8 shows an alternative embodiment using a window comparator. In this case, the up and down switches are only closed when the drain voltage of Msense is outside of a voltage window $\pm\Delta$ around Vx which means that the sense current Isense is very close to the reference value Iref.

In the embodiment shown in FIG. 9, the charge pump switches for coupling the pull up and pull down current sources to the reference capacitor Cref are controlled by one-shot pulse generators OP1, OP2 that produce only a short pulse after a rising edge of the comparator output. Consequently, the reference voltage Vref only changes in small steps instead of continuously ramping up or down.

For illustration, FIG. 10 shows a simulated output current Iout, reference voltage Vref and up and down signals during regulation, for a circuit using a window comparator.

In this simulation a random noise current is injected on Cref. As can be seen, the reference voltage Vref is regulated between two levels of the window comparator. When the reference voltage Vref crosses the window boundary an up or down pulse is generated.

In the middle of the graph (at 125 us) the reference current Iref is increased from 90 $\mu$A to 100 $\mu$A. The loop reacts by producing a sequence of up pulses that increase the reference voltage Vref until it reaches the new steady state.

The fast current switch described can be used in the switching output stage of a class-D audio amplifier. The current switches can be applied in the gate drive of the output transistors to obtain slope control.

The power transistors in the output stage can for example be split up into e.g. eight equal sections that can be driven independently. The slope speed is adjusted by changing the reference current of the loop.

All embodiments shown are current sinks using NMOS transistors but the same techniques can be applied to realize current sources using PMOS transistors as well.

The invention enables a very large current mirror ratio to be achieved, namely the ratio between Iref and Iout.

The switches shown in the figures are of course also implemented as transistors, in routine manner.

A typical value of Iref is in the range 50 $\mu$A to 200 $\mu$A. With a size ratio between the sense and output transistors (i.e. the W/L ratio of one compared to the other) of around 1:100, the output current (when the current source circuit is switched on) can for example be of the order of 5 to 10 mA (as can be seen in FIG. 10).

The reference voltage is typically around 0.7V.

The invention achieves slope control in switching output stages. Such stages are part of class-D amplifiers and also switch-mode power supplies. There are other applications, for example in D/A converters.

Various modifications will be apparent to those skilled in the art.

The invention claimed is:

1. A switching circuit for providing a switched current source output, comprising:
    a reference voltage input device, which comprises a reference voltage charge storage device;
    a gate voltage charge storage arrangement for storing a precharge voltage derived from the reference voltage;
    a reference current source providing a reference current;
    an output transistor;
    a current sensing transistor for generating a sense current dependent on the current source output and which is supplied by the reference current source;
    an isolating switch arrangement for selectively coupling or isolating the gate of the output transistor and the gate of the current sensing transistor to or from the gate voltage charge storage arrangement;
    a discharge switch arrangement for discharging the gate of the output transistor and the gate of the current sensing transistor;
    a feedback loop for controlling the reference voltage stored on the reference voltage charge storage device to maintain the sense current substantially equal to the reference current.

2. A switching circuit as claimed in claim 1, which is operable in two modes:
    a precharge mode, in which the gate voltage charge storage arrangement is precharged by the reference voltage and the output transistor gate and the current sensing transistor gate is discharged through the discharge switch arrangement, and the isolating switch arrangement isolates the gate voltage charge storage arrangement from the output transistor gate; and
    a discharge mode, in which the gate voltage charge storage arrangement is discharged to the output transistor gate and sense transistor gate through the isolating switch arrangement.

3. A circuit as claimed in claim 1, wherein the reference voltage input device comprises a comparator, which depending on the sign of a difference between the reference current and the sense current, controls the charging or discharging of the reference voltage charge storage device.

4. A circuit as claimed in claim 3, comprising a pull up current source and a pull down current source, wherein the comparator output is used to couple a selected one of the pull up and pull down current sources to the reference voltage charge storage device.

5. A circuit as claimed in claim 4, wherein the comparator comprises a window comparator.

6. A circuit as claimed in claim 5, comprising a pulse converter for converting the window comparator output to up and down pulses for controlling the pull up current source and the pull down current source.

7. A circuit as claimed in claim 1, comprising a buffer between the reference voltage input device and the gate voltage charge storage arrangement.

8. A switching output stages for a class-D amplifiers or for a switch-mode power supply, comprising a circuit as claimed in claim 1.

* * * * *